United States Patent [19]

Martel et al.

[11] 4,357,583
[45] Nov. 2, 1982

[54] PASSIVE ELECTROMAGNETIC WAVE LIMITER AND DUPLEXER FORMED BY MEANS OF SUCH A LIMITER

[75] Inventors: Jacques Martel; Gilles Sillard, both of Paris, France

[73] Assignee: Thomson-CSF, Paris, France

[21] Appl. No.: 153,781

[22] Filed: May 27, 1980

[30] Foreign Application Priority Data

May 31, 1979 [FR] France ............................ 79 13988

[51] Int. Cl.³ ........................................... H03G 11/02
[52] U.S. Cl. .................................. 333/17 L; 333/250; 333/252; 361/1
[58] Field of Search .................. 361/56, 1; 333/17 L, 333/250

[56] References Cited

U.S. PATENT DOCUMENTS

| | | | |
|---|---|---|---|
| 3,174,119 | 3/1965 | Jones et al. | 361/1 X |
| 3,202,942 | 8/1965 | Garver et al. | 333/17 L |
| 3,448,414 | 6/1969 | Brunton | 333/17 L X |
| 3,768,044 | 10/1973 | Henry et al. | 333/17 L |

*Primary Examiner*—Reinhard J. Eisenzopf

[57] ABSTRACT

A passive limiter formed as a wave-guide, in at least one cross-section of the guide, by means of one or more resonating windows in which is shunt-mounted at least head-to-tail one pair of diodes having the same polarity and being disposed in the same plane. One or more such limiters may be contemplated for forming duplexers.

19 Claims, 8 Drawing Figures

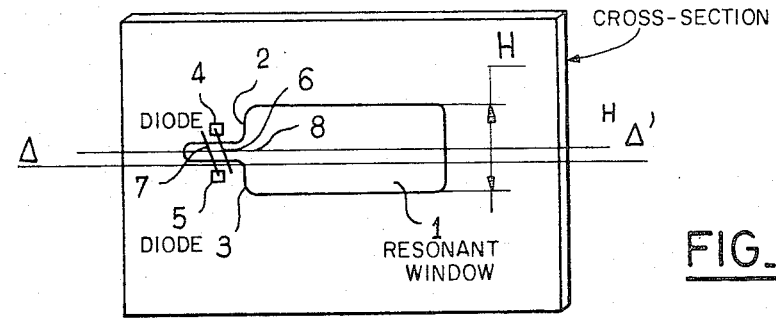
FIG_1
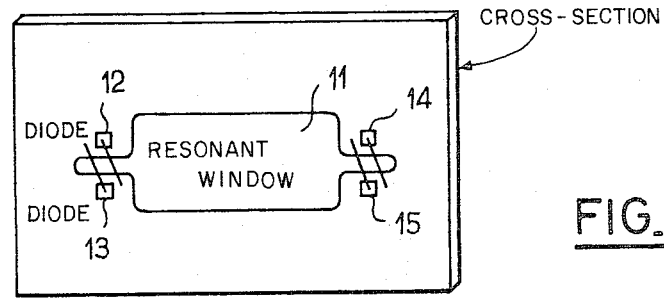
FIG_3
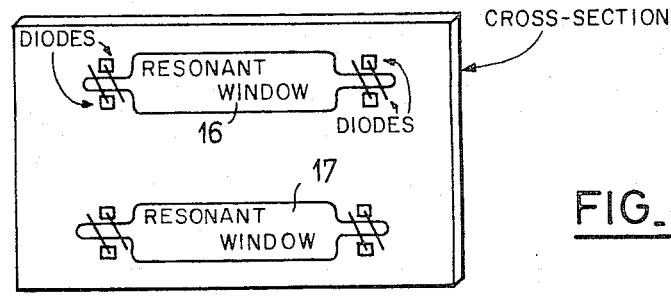
FIG_4
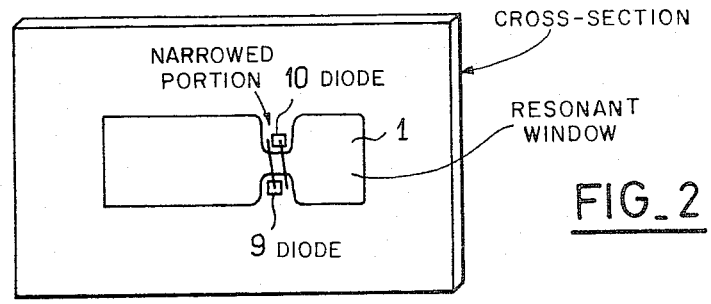
FIG_2

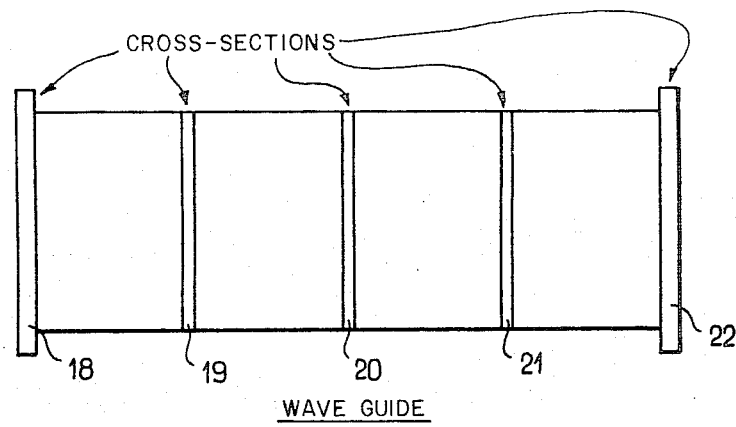
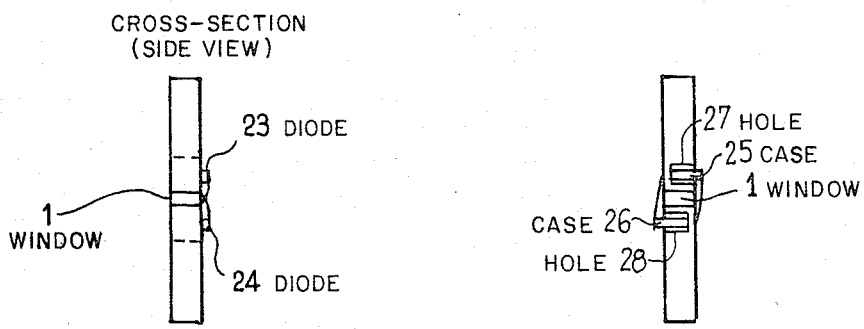
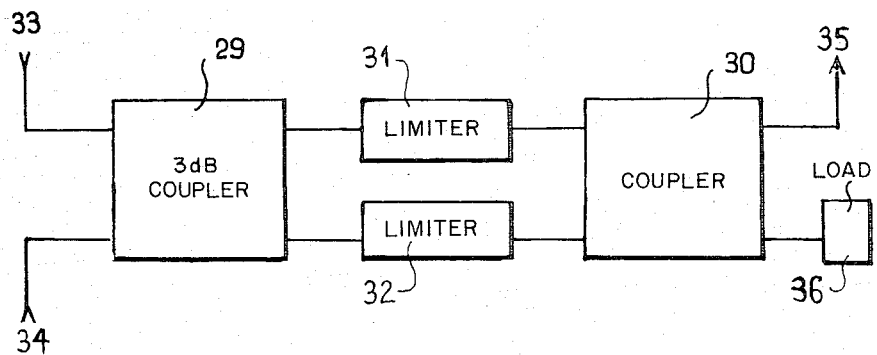

PASSIVE ELECTROMAGNETIC WAVE LIMITER AND DUPLEXER FORMED BY MEANS OF SUCH A LIMITER

BACKGROUND OF THE INVENTION

The invention relates to passive electromagnetic wave limiters as well as to duplexers which can be constructed by means of these limiters.

Passive limiters are generally formed by diodes whose performances reflect those which may then be expected from the duplexing devices which comprise them. Precise details are given in "Radar Handbook" by M. SKOLNIK, 1970 p. 8.24.

In fact, the passive limiters of the invention must be able to withstand ultra-high frequency peak powers of the order of a few hundred kilowatts.

In electromagnetic detection or radar equipment to which the present invention more particularly applies, the protection of the receiver of the radar against transmissions from its own transmitter or from neighboring transmitters has formed a problem to which particular attention has been paid from the outset. If fact, in a radar the duplexers which are limiters inserted in the receiving chain between two 3 dB junctions function, in the case where the equipment operates with a single common transmitting-receiving antenna, to decouple considerably the transmitter from the receiver by at least 40 decibels.

The role and the operation of a duplexer in a radar connected to a single antenna will be recalled briefly. It is absolutely necessary to avoid high-level energy imparted by the transmitter to the antenna from reaching the receiver which it would destroy. The same goes for the energy transmitted from a radar adjacent the one concerned. Conversely, it is extremely desirable that any energy collected by the antenna from a target illuminated by the transmitted radiation be passed on without loss to the receiver. The duplexer also plays the role of a switch isolating the receiver during transmission or during a powerful adjacent transmission and opening the channel during reception.

The protection of radar receivers against high powers from their transmitter or that of neighboring transmitters was first of all provided by gas tubes, called TR tubes which, inserted into the receiving chain had the structure of a pass-band filter and the property of being passing when the ultra-high frequency energy applied was low and reflecting when this energy exceeded a few watts peak. These tubes (which moreover gave satisfaction) presented the drawbacks due to limited life expectancy and a slight delay on ignition, thus letting through a part of the power towards the receiver which finished by being damaged.

The appearance of P.I.N. diodes enabled in some cases these gas tubes to be replaced by switches which are more reliable as regards their life expectancy. However, it is necessary to associate with these PIN diodes a control circuit for enabling them a little before transmission by means of an auxiliary biasing source and to apply thereto an inverse voltage so as to reduce losses at the moment of reception. Since these control circuits are synchronous with the radar transmission, the PIN diode switches do not however protect the radar receiver against neighboring transmitters.

Finally, the use of specially-designed diodes associated in pairs has made possible the construction of a solid-state protection device, entirely passive and able to withstand powers of about ten kilowatts peak. However, despite the fact of mounting the diodes in cases having a ceramic part made from a good heat-conducting material, such as Beryllium oxide, the heating caused by their losses, although very small, leads to their destruction when the transmission power becomes too great. Indeed, the diodes are in a zone where coupling is maximum. Another drawback concerning the use of these diodes for devices usable as high-power wave-guides and at low frequencies is that the dimensions of the ultra-high frequency structures are very large compared with the dimensions of the diodes, thus making it difficult to optimize the performances thereof.

SUMMARY OF THE INVENTION

The aim of the present invention is to provide passive limiters usable as wave-guides exempt from the above-mentioned drawbacks and capable of transporting a large amount of energy with high peak powers, and able to be grouped to form duplexers therefrom.

According to the invention, a limiter is constructed as a guide comprising at least one resonating window, situated in a cross-section, in which a pair of diodes having the same polarity and disposed in the same plane are shunt-mounted head to tail.

Thus may be obtained limiters formed from one or more pairs of diodes and duplexers by inserting these limiters between two 3 dB couplers.

The above and other objects, features and advantages of the present invention will become apparent from the following description, given solely by way of non-limiting illustration, when taken in conjunction with the accompanying drawings.

DESCRIPTION OF THE DRAWINGS

FIG. 1 shows a limiter in accordance with the invention constructed in a cross-section of a guide.

FIGS. 2 to 5 show non-limiting embodiments of limiters in accordance with the invention.

FIGS. 6 and 7 are two side views of a limiter in accordance with the invention.

FIG. 8 shows a duplexer constructed according to the invention.

DESCRIPTION OF THE PREFERRED EMBODIMENTS

FIG. 1 shows a front view of a cross-section of the wave-guide in which the limiter of the invention is formed. This limiter is formed by one or more cross-sections each comprising one or more resonating windows.

The cross-section of FIG. 1 comprises a resonating window 1 having an axis $\Delta'$ parallel to the longitudinal axis $\Delta$ of the section, whose dimensions depend on the power that the limiter is to be able to withstand and on the desired limitation. On each of the two edges 2 and 3 of window 1 is placed a diode 4 or 5, connected to the other edge by a metal connecting wire 6 or 7. The two diodes 4 and 5 are placed head-to-tail symmetrically with respect to the axis $\Delta'$ of window 1, in the same plane, which permits the use of diodes having the same polarity. This mounting ensures good heat dissipation due to the metal mass of the device and a perfect symmetry due to the polarity of the diodes. To reduce the inductance of the connecting wires 6 and 7, the height H of window 1—or dimension perpendicular to the axis $\Delta'$ of the window—is reduced at the location of the diodes, causing narrowing 8 of window 1. At a low power level, diodes 4 and 5 behave like capacitors and the assembly formed by window 1 and diodes 4 and 5 resonates at the desired frequency, thus letting through the ultra-high frequency energy. When the power level rises, one of the diodes behaves like a short-circuit, and detunes the device which no longer resonates at the desired frequency, thus ensuring the limitation. With the diodes being mounted head-to-tail and in the same plane, it is either one or the other diode which conducts according to the polarity of the ultra-high frequency signal, thus protecting the other diode and ensuring good power behavior.

The device of the invention has the advantage of allowing the diodes to be mounted at any location of the window, so that the coupling of the diodes may be easily modified according to the desired limitation and power resistance. Since the ultra-high frequency field is zero at the ends of the window, and maximum in the center, the diodes 9 and 10 are placed at the ends of window 1 or towards the center as shown in FIG. 2 according to the desired coupling.

When it is desired to increase the power behavior on the limiter for the same limitation, symmetrical window 11 is formed comprising a pair of diodes 12 and 13 and 14 and 15 at each end, as shown in FIG. 3. To increase the width of the band of operating frequencies of the limiter, the overvoltage coefficient of the device is increased, by forming two or more windows 16 and 17, as shown in FIG. 4.

The limiter of the invention may also be formed by several cross-sections 18 and 20, such as previously described, whether they comprise one or more windows each. FIG. 5 shows such a limiter, having a certain overvoltage coefficient distribution and whose different cross-sections 18 to 22 are spaced so as to form a filter. Experience shows that 6 dB of limitation are gained when the spacing between each section is equal to a quarter of a wavelength at the central frequency of the operating band. The different cross-sections forming the limiter are distributed so that the diodes are weakly coupled, thus ensuring good power behavior but low limitation at the input to the limiter and so that they are more and more coupled according to the power applied in order to provide good limitation towards the output of the limiter.

In all the types of limiter in accordance with the invention which have just been described, naked diodes 23 and 24 are placed on the same side of window 1, symmetrically with respect to the axis Δ' of the window, as shown in the side view of a cross-section in FIG. 6. So that they may be opposite each other with respect to axis Δ', the connecting wire which connects them to the other edge is placed obliquely as can be seen in FIGS. 1 to 4. The diodes may also be placed in a case 25 and 26 so that they are less fragile in use. In this case, a non-limiting embodiment is shown in FIG. 7. Two holes 27 and 28 are formed in the metal part surrounding the resonating window 1 so that the diodes are almost situated in the same plane.

As was pointed out in the introduction, the limiters in accordance with the invention which have just been described may be used to form duplexers whose role is important in electromagnetic detection or radar equipment. The receiver of the radar must be protected both against the high-power transmissions from its own transmitter and against the transmissions from transmitters close to the one concerned.

Generally a duplexer is formed from two identical limiters inserted between two 3 dB couplers. FIG. 8 shows the diagram of a duplexer formed from two 3 dB couplers 29 and 30 and two limiters 31 and 32 of the invention.

The input of 3 dB coupler 29 is connected on the one hand to transmitter 33 and, on the other hand, to the transmitting-receiving antenna 34, whereas its two outputs are connected respectively to the two limiters 31 and 32 of the invention. The output of each limiter is connected to the input of the coupler 30 one output of which is connected to the receiver 35 and the other output of which is connected to a dissipating load 36. During transmission, the high-power energy transmitted by transmitter 33 passes into coupler 29, is reflected on limiters 31 and 32 which act as a switch, thanks to the diodes which become equivalent to short-circuits, and is sent back through coupler 29 to antenna 34. The limiters thus prevent any power transmitted by the transmitter from damaging the receiver. Conversely, during reception, the much weaker energy picked up by the antenna 34 passes into limiters 31 and 32 which let pass the low-level energy conveyed. The energy is then concentrated by coupler 30 before going to receiver 35.

Depending on the transmission power and on the desired limitation, the limiters 31 and 32 are constructed as shown in the different FIGS. 1 to 7.

Thus has been described in what has gone before improvements to passive limiters and to duplexers comprising such limiters.

It is apparent that within the scope of the invention, modifications and different arrangements can be made other than are here disclosed. The present disclosure is merely illustrative with the invention comprehending all variations thereof.

What is claimed is:

1. A passive semi-conductor electromagnetic wave limiter with low capacity and high cut-off frequency, comprising a wave guide and at least a pair of diodes of same polarity mounted oppositely in shunt connection in said wave guide, the improvements comprising at least a resonant window arranged in a cross-section plane of said wave guide in which said pair of diodes of same polarity and oppositely mounted in shunt, are connected between the edges of said window in the same plane.

2. A passive semi-conductor electromagnetic wave limiter as claimed in claim 14, wherein the shape of the window, is modified at places where said diodes are arranged, by reducing the height of said window perpendicular to the longitudinal axis of said cross-section for forming a narrowed portion resulting in a reduction of the inductance of wires connecting said diodes to the edges of said window.

3. A passive limiter as claimed in claim 2, wherein a narrowed portion of said window is situated at one of the ends of the window situated along the axis of the same window, so as to reduce the coupling of the diodes placed at said narrowed portion.

4. A passive limiter as claimed in claim 2, wherein a narrowed portion of said window is situated between the two ends of the window, the coupling of the diodes placed at said narrowed portion being maximum at the center of the window.

5. A passive limiter as claimed in claim 2, wherein, a narrowed portion is formed into each end of said window situated along its axis, with at least one pair of diodes placed at each said narrowed portions, to provide better power resistance.

6. A passive limiter as claimed in claim 2, wherein the two diodes of a pair are each mounted on one of the edges of said window, symmetrically in relation to the axis of the window parallel to the longitudinal axis of the cross-section of the guide and are connected to the other edge by means of a metal connecting wire.

7. A passive limiter as claimed in claim 6, wherein a narrowed portion of said window is situated at one of the ends of the window situated along the axis of the same window, so as to reduce the coupling of the diodes placed at said narrowed portion.

8. A passive limiter as claimed in claim 6, wherein a narrowed portion of said window is situated between the two ends of the window, the coupling of the diodes placed at said narrowed portion being maximum at the center of the window.

9. A passive limiter as claimed in claim 6, wherein, a narrowed portion is formed into each end of said window situated along its axis, with at least one pair of diodes placed at each said narrowed portions, to provide better power resistance.

10. A passive limiter as claimed in claim 1, comprising several windows placed in the same cross-section of said wave guide, for increasing the width of the operating band.

11. A passive limiter as claimed in claim 1, comprising at least one resonating window in a plurality of cross-section planes of said wave guide.

12. A passive limiter as claimed in claim 11, wherein the distance between said plurality of cross-sections of said guide is equal to a quarter of a wavelength at the central frequency of the operating band.

13. A passive limiter as claimed in any one of claims 1 or 12, wherein the two diodes of one pair are placed on the same side of the window on two opposite edges, symmetrically in relation to the axis of the window.

14. A passive limiter as claimed in claim 13, wherein the connecting wire connecting each diode to the edge of said window, opposite that where it is mounted, is disposed obliquely allowing the two diodes to be placed facing one another.

15. A duplexer made from at least one passive limiter as claimed in claim 14.

16. A duplexer made from at least one passive limiter as claimed in claim 13.

17. A passive limiter as claimed in any one of claims 1 to 12, wherein the two diodes of one pair are each mounted in a case, placed in two holes formed on each side of the window.

18. A duplexer made from at least one passive limiter as claimed in claim 17.

19. A duplexer made from at least one passive limiter as claimed in any one of claims 1 to 12.

* * * * *